US008462957B2

(12) United States Patent
Fujii et al.

(10) Patent No.: US 8,462,957 B2
(45) Date of Patent: Jun. 11, 2013

(54) HEARING AID AND METHOD OF CONTROLLING VOLUME OF HEARING AID

(75) Inventors: Shigekiyo Fujii, Kanagawa (JP); Hiroshi Kondo, Kanagawa (JP); Yasushi Ueda, Ehime (JP); Yasushi Imamura, Ehime (JP); Kazutaka Maruoka, Ehime (JP)

(73) Assignee: Panasonic Corporation, Osaka (JP)

( * ) Notice: Subject to any disclaimer, the term of this patent is extended or adjusted under 35 U.S.C. 154(b) by 204 days.

(21) Appl. No.: 12/935,358

(22) PCT Filed: Feb. 17, 2010

(86) PCT No.: PCT/JP2010/001014
§ 371 (c)(1), (2), (4) Date: Sep. 29, 2010

(87) PCT Pub. No.: WO2010/095431
PCT Pub. Date: Aug. 26, 2010

(65) Prior Publication Data
US 2011/0019848 A1 Jan. 27, 2011

(30) Foreign Application Priority Data
Feb. 19, 2009 (JP) ................................ 2009-036487

(51) Int. Cl.
*H04R 29/00* (2006.01)
*H04R 25/00* (2006.01)
*H01C 10/00* (2006.01)
*H03G 3/00* (2006.01)

(52) U.S. Cl.
USPC ................ 381/60; 381/107; 381/321; 338/60

(58) Field of Classification Search
USPC .................. 381/60, 107, 108, 315, 321, 322, 381/324; 338/68–201
See application file for complete search history.

(56) References Cited

U.S. PATENT DOCUMENTS 4,329,676 A * 5/1982 McDonald et al. ........... 381/322
4,926,139 A 5/1990 Anderson et al.

(Continued)

FOREIGN PATENT DOCUMENTS

DE 24 00 804 7/1975
JP 56-169700 5/1981

(Continued)

OTHER PUBLICATIONS

International Search Report issued May 18, 2010 in International (PCT) Application No. PCT/JP2010/001014.

(Continued)

*Primary Examiner* — Jesse Elbin
(74) *Attorney, Agent, or Firm* — Wenderoth, Lind & Ponack, L.L.P.

(57) ABSTRACT

A hearing aid (101) comprises a microphone (121) converting sound into an electrical signal, a processor (105) disposed inside a main body case (102), a first volume adjuster (104) having a variable resistor, and a receiver (123) converting an electrical signal into sound. The processor (105) has an amplifier (135) amplifying an electrical signal from the microphone (121), a second volume adjuster (**105*b*) setting a degree of amplification by the amplifier (135), and a controller (130) controlling the second volume adjuster (105*b*) and the amplifier (135). The controller (130) detects the resistance value of the variable resistor, determines whether or not the resistance value has exceeded a specific threshold, acquires a specific value for the degree of amplification by the amplifier (135), and sets the degree of amplification by the amplifier (135**) to this specific value when the controller determines that the resistance value has exceeded the specific threshold.

6 Claims, 5 Drawing Sheets

101

U.S. PATENT DOCUMENTS

| | | | | |
|---|---|---|---|---|
| 5,046,107 | A * | 9/1991 | Iwamatsu | 381/107 |
| 5,165,017 | A * | 11/1992 | Eddington et al. | 381/321 |
| 5,189,705 | A | 2/1993 | Lavaud | |
| 5,394,476 | A | 2/1995 | Rollins et al. | |
| 5,406,633 | A * | 4/1995 | Miller et al. | 381/321 |
| 5,862,238 | A | 1/1999 | Agnew et al. | |
| 5,907,622 | A * | 5/1999 | Dougherty | 381/108 |
| 6,370,254 | B1 * | 4/2002 | Gore et al. | 381/107 |
| 7,539,320 | B2 | 5/2009 | Fujii et al. | |
| 2003/0002688 | A1 | 1/2003 | Kanevsky et al. | |
| 2004/0202333 | A1 | 10/2004 | Csermak et al. | |
| 2006/0198530 | A1 * | 9/2006 | Fischer et al. | 381/60 |
| 2007/0058828 | A1 | 3/2007 | Fujii et al. | |
| 2007/0177749 | A1 | 8/2007 | Sjursen et al. | |
| 2010/0098280 | A1 | 4/2010 | Sjursen et al. | |
| 2010/0119094 | A1 | 5/2010 | Sjursen et al. | |

FOREIGN PATENT DOCUMENTS

| | | |
|---|---|---|
| JP | 5-130698 | 5/1993 |
| JP | 2011-196959 | 7/2001 |
| JP | 2005-65124 | 3/2005 |
| JP | 2007-142701 | 6/2007 |

OTHER PUBLICATIONS

Written Opinion of the International Searching Authority issued May 18, 2010 in International (PCT) Application No. PCT/JP2010/001014.

Supplementary European Search Report issued Mar. 4, 2011 in Application No. EP 10 74 3561.

Office Action issued Oct. 20, 2011 in corresponding European Application No. 10 743 561.2.

* cited by examiner

HEARING AID AND METHOD OF CONTROLLING VOLUME OF HEARING AID

TECHNICAL FIELD

The present invention relates to a hearing aid and a method for controlling the volume of a hearing aid.

BACKGROUND ART

The most common type of hearing aid is one equipped with a so-called electrical volume, which is a means for converting input sound into electrical signal, then automatically correcting the degree of amplification of this electrical signal by digital processing, and thereby adjusting the volume of the output signal. On the other hand, many hearing aid wearers require a mechanical volume, with which a wearer can easily adjust the volume manually. Accordingly, there have been hearing aids equipped with both a mechanical volume and an electrical volume.

FIG. 5A shows an example of the configuration of a conventional hearing aid 1 (see Patent Citation 1, for example). The hearing aid 1 comprises a microphone 11, an amplifier 12, a receiver 13, a mechanical volume 14, and an electrical volume 15. With the hearing aid shown in FIG. 5A, the microphone 11 collects audible sound and converts it into an electrical signal, that is, an audible signal. The amplifier 12 amplifies the audible output signal from the microphone 11. The receiver 13 converts the audible output signal from the amplifier 12 into audible sound.

The mechanical volume 14 is constituted by a microminiature rotating variable resistor, is a mechanical volume adjusting means connected between the amplifier 12 and ground, and sets the upper limit for the level of an audible signal passing through the amplifier 12 to be adjusted.

The electrical volume 15 is also connected between the amplifier 12 and ground. The electrical volume 15 adjusts the level of the audible signal in tiny steps, and in turn performs volume adjustment, within the range of up to the upper limit set by the mechanical volume 14.

FIG. 5B is a diagrammatic perspective view of the above-mentioned hearing aid 1.

In FIG. 5B, a casing 16 has an insertion component 16*a* and a control component 16*b*. The insertion component 16*a* is the portion that is inserted into the ear, and the control component 16*b* is the portion the user operates to adjust the volume. The mechanical volume 14, the electrical volume 15, and the microphone 11 are attached to the attachment face 16*c*. The amplifier 12, the receiver 13, etc., are held inside the casing 16.

The operation of the above-mentioned conventional hearing aid 1 will now be described.

With the above-mentioned hearing aid 1, audible sound collected by the microphone 11 is converted into an audible signal and inputted to the amplifier 12. After the audible signal has been amplified by the amplifier 12, it is outputted to the receiver 13 and converted into audible sound. The hearing aid wearer sets the upper limit of the volume adjustment range by operating the mechanical volume 14, which makes use of the microminiature rotating variable resistor. The electrical volume 15 fine tunes the level of the audible signal, and in turn the volume, passing through the amplifier 12, in tiny steps, within the range of up to the upper limit thus set.

The volume of the hearing aid 1 is controlled by a volume switch (that is, the mechanical volume 14, which includes the variable resistor) and an LSI circuit connected to the volume switch (including the electrical volume 15 and the amplifier

12). For example, Table 1 shows an example in which the largest graduation on the volume switch is "5," and the maximum resistance value of the variable resistor is 200 ohms, and the LSI chip subjects the resistance value to A/D conversion with eight bits. In this example, the relation between the value of the degree of amplification performed by the LSI chip and the volume is as shown in Table 1.

TABLE 1

| Graduation on Volume Switch | Value of Variable Resistor | Degree of Amplification by LSI (after A/D conversion) | Volume |
|---|---|---|---|
| 0 | 0 | 0 | 0 |
| 5 (MAX) | 200 ohms | 255 | Maximum volume (the upper limit or less) |

Specifically, when the graduation on the volume switch is at "0," the value of the variable resistor (the resistance value) is zero ohms. When the LSI chip subjects this resistance value to A/D conversion with eight bits, the value is also "0," and the volume outputted from the receiver 13 is "0."

Meanwhile, if the graduation on the volume switch is at "5 (MAX)," the resistance value is 200 ohms, for example. In this case, the value of the degree of amplification by the LSI chip after A/D conversion is "255," which is the maximum value produced by 8-bit A/D conversion, and the sound is reproduced at the highest volume (not greater than the upper limit).

FIG. 6 shows an example of the internal configuration of another conventional hearing aid which performs automatic control so that excessive volume is not outputted in the event that an impact noise or excessively loud noise is inputted (see Patent Citation 2, for example).

In the example shown in FIG. 6, when an impulsive input signal such as an impact noise or excessively loud noise is inputted to the microphone 10, which is an input transducer, this input signal is applied to the amplifier 30 via the capacitor C1 and amplified at a specific gain. The amplified signal is outputted by the earphone 20, which is a receiver equipped with a class D amplifier, via the capacitor C2.

DC power is supplied by the battery 80 (and the capacitor C3) to the microphone 10, the amplifier 30, and the earphone 20. The output signal (at connection point B) of the amplifier 30 is monitored by the amplification circuit 70 and the rectification circuit 50, and the input signal (at connection point A) of the amplifier 30 is attenuated by the biasing circuit 60 and the attenuation circuit 40 so as not to become excessively large.

The operation of the hearing aid thus constituted will now be described.

First, an input sound to the microphone 10 is applied to the amplifier 30 and the transistor 41.

The output from the amplifier 30 is applied to the earphone 20 and the amplification circuit 70. The AC signal applied to the amplification circuit 70 is rectified by diodes 51 and 52 in the rectification circuit 50, and is smoothed and converted into DC voltage by the smoothing capacitor 53. This DC voltage is added to bias voltage applied by the transistor 61 in the biasing circuit 60, and becomes the base voltage of the transistor 41 of the attenuation circuit 40. The transistor 41 here operates when the base voltage of the transistor 41 exceeds a threshold determined by the variable resistor 42, the signal from the input stage of the amplifier 30 is pulled in and attenuated, and the output of the earphone 20 is also suppressed.

Thus, no RC filter having a time constant or the like is used for the signal line inside the automatic gain control circuit, so response time from signal input to the start of suppression is short. When the input signal is small, the base voltage of the transistor 41 does not exceed the threshold determined by the variable resistor 42, so the input signal of the amplifier 30 is not attenuated, and there is no effect on the output of the earphone 20.

PRIOR ART PUBLICATIONS

Patent Citations

Patent Citation 1: Japanese Laid-Open Patent Application H5-130698

Patent Citation 2: Japanese Laid-Open Patent Application 2005-65124

DISCLOSURE OF INVENTION

Technical Problem

With the conventional example shown in FIGS. 5A and 5B, if the volume switch malfunction and disconnection should occur between the mechanical volume 14 and the LSI chip (the amplifier 12), the resistance value of the volume switch will become infinitely high. Accordingly, the output sound of the receiver 13 is reproduced at the maximum volume. This can injure the ear of the hearing aid wearer, startle the wearer, or cause other such problems.

More specifically, a hearing aid has a structure in which perspiration or other such moisture tends to penetrate into the interior of the mechanical volume 14 and the interior of the hearing aid. Therefore, the mechanical volume is susceptible to malfunction. Because a thin substrate or fine lead wires are used for the connection between the mechanical volume 14 and the LSI chip including the electrical volume 15, disconnection is apt to occur. Therefore, the problems mentioned above occur.

For example, as shown in Table 2, let us assume that disconnection occurs between the mechanical volume 14 and the LSI chip (the amplifier 12) in the case where the highest graduation on the volume switch is "5." In this case, even though the hearing aid wearer has set the graduation on the volume switch to "3" to suit his own hearing, the LSI chip does not recognize that the variable resistor of the volume switch is at infinitely high ohms because of the disconnection, so the speech ends up being reproduced at the maximum volume.

TABLE 2

| Graduation on Volume Switch | Value of Variable Resistor | Degree of Amplification by LSI (after A/D conversion) | Volume |
|---|---|---|---|
| 0 | 0 | 0 | 0 |
| 3 | Infinitely high ohms | 255 | Maximum volume (the upper limit or less) |

With a conventional hearing aid such as this, even though it had both an electrical volume under LSI control and a mechanical volume equipped with a variable resistor, if the resistance of the mechanical volume went to infinity due to disconnection, corrosion, or the like, the LSI chip recognized this a maximum volume setting and raised the volume, which startled the wearer, hurt his ears, or caused other such problems.

Also, with the conventional hearing aid shown in FIG. 6, since it has the variable resistor 42, disconnection, corrosion, and other such problems occur just as with the conventional example shown in FIGS. 5A and 5B, which again leads to problems such as the inability to adjust the volume.

In view of this, it is an object of the present invention to provide a hearing aid and a method for controlling the volume of a hearing aid, with which speech reproduction at the proper volume is guaranteed even if the mechanical volume adjusting means should malfunction.

Technical Solution

According to a first aspect of the present invention, the hearing aid comprises a main body case, a microphone, a processor, a first volume adjuster, and a receiver. The microphone is disposed inside the main body case, and converts sound into an electrical signal. The processor is disposed inside the main body case. The first volume adjuster has a variable resistor and a control component disposed so as to be exposed on the outside of the main body case and configured to set the resistance value of the variable resistor. The receiver converts the electrical signal into sound. The processor has an amplifier, a second volume adjuster, and a controller. The amplifier amplifies the electrical signal from the microphone. The second volume adjuster sets a degree of amplification by the amplifier according to the resistance value of the variable resistor of the first volume adjuster. The controller controls the amplifier and the second volume adjuster. The controller detects the resistance value of the variable resistor of the first volume adjuster, determines whether or not the resistance value has exceeded a specific threshold, and when the resistance value has exceeded the specific threshold, acquires a specific value for the degree of amplification by the amplifier and sets the degree of amplification by the amplifier to the same specific value.

The second volume adjuster may set an upper limit to the degree of amplification by the amplifier, and set the degree of amplification by the amplifier to within a range that is not higher than the upper limit, and when the controller determines that the resistance value has exceeded the specific threshold, the controller may acquire a specific value for the degree of amplification by the amplifier that is not higher than the upper limit.

The processor further may have an alarm connected to the controller and configured to issue a warning when the controller determines that the resistance value has exceeded the threshold.

The hearing aid may further comprise a memory connected to the controller and configured to store the specific value, wherein the controller acquires the specific value from the memory.

The above-mentioned specific value may be the degree of amplification according to a value related to a specific resistance value set in the past by the first volume adjuster. Here, the "value related to a specific resistance value set in the past by the first volume adjuster" may be the specific resistance value set in the past itself, or may be an average of a plurality of resistance values, the most frequent value, or the like, for example.

The processor may further have a threshold storage component configured to store the threshold.

A second aspect of the present invention is a method of controlling a volume of a hearing aid that includes a microphone configured to convert sound into an electrical signal, a first volume adjuster that includes a variable resistor and sets a resistance value of the variable resistor, an amplifier configured to amplify an electrical signal from the microphone, a receiver configured to convert the amplified electrical signal into sound, and a processor configured to control the amplifier, wherein the following procedure is executed by the processor in this method:

detecting the resistance value of the variable resistor of the first volume adjuster;

determining whether or not the resistance value has exceeded a specific threshold;

setting the degree of amplification of the electrical signal according to the resistance value of the variable resistor of the first volume adjuster when it is determined that the resistance value does not exceed the specific threshold; and when it is determined that the resistance value has exceeded the specific threshold, acquiring a specific value for the degree of amplification of the electrical signal by the amplifier, and setting the degree of amplification by the amplifier to the specific value.

Advantageous Effects

As described above, with the hearing aid pertaining to the present invention, speech reproduction at the proper volume is guaranteed even if the mechanical volume adjusting means should malfunction.

BEST MODE FOR CARRYING OUT THE INVENTION

1. Embodiments

1.1 External Configuration of Hearing Aid 101

Figure 1:
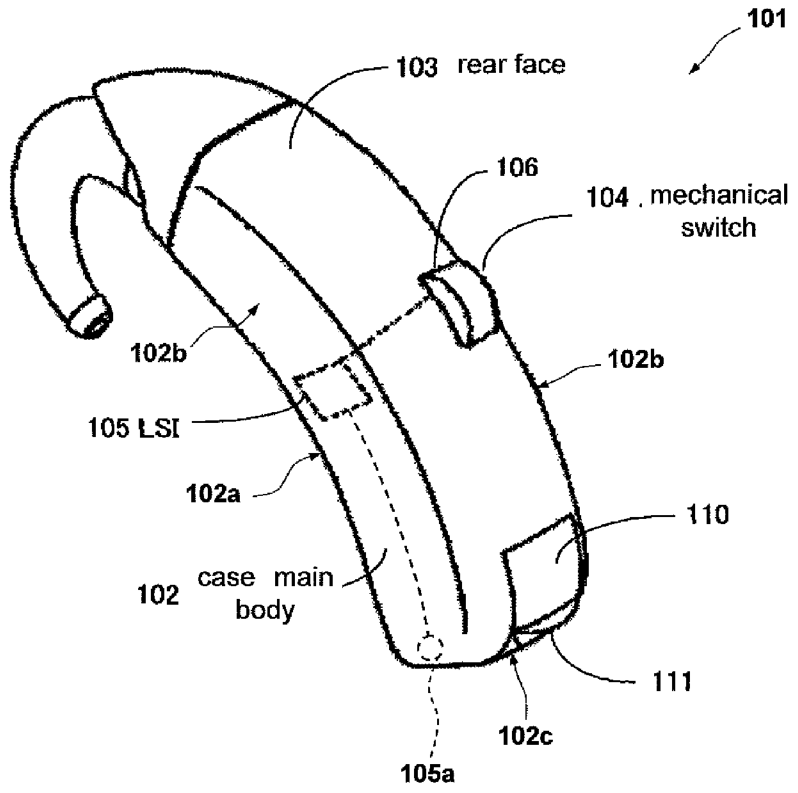
FIG. 1 is a simplified diagram of the outside of a BTE (Behind-The-Ear) hearing aid 101 pertaining to an embodiment of the present invention.

FIG. 1 is a simplified diagram of the outside of a BTE hearing aid 101 pertaining to an embodiment of the present invention. A BTE hearing aid is a type of hearing aid that is used by hooking it on the outside of the ear.

As shown in FIG. 1, the BTE hearing aid 101 comprises a microphone (FIG. 2) for converting inputted sound (speech) into an electrical signal, an LSI chip 105 (an example of a processor) for controlling the frequency characteristics of the inputted sound and amplifying the output signal of the microphone, a receiver (FIG. 2) for converting the output signal of the LSI chip 105 into speech, and so forth, which are housed inside the main body case 102. Also, the mechanical switch 104 (an example of a first volume adjuster), which is a volume switch used for gain adjustment, a power switch (not shown), and so forth are provided on the rear face 103 of the main body case 102.

The main body case 102 is designed to be disposed along the rear side of the hearing aid wearer's ear auricle when the wearer is wearing the hearing aid 101. The overall shape of the main body case 102 is a curved, substantially rectangular shape. The main body case 102 has the rear face 103, a front face 102*a* on the opposite side from the rear face 103, two side faces 102*b* that link the front face 102*a* and the rear face 103, and a bottom face 102*c* that links the front face 102*a*, the rear face 103, and the two side faces 102*b*. The front face 102*a* and one of the side faces 102*b* of the main body case 102 are designed to be disposed so as to be in contact with the rear side of the ear auricle of the wearer when the wearer is wearing the hearing aid 101. The other of the side faces 102*b* of the main body case 102 is designed to be disposed so as to be in contact with the head of the wearer. The bottom face 102*c* of the main body case 102 is designed to be disposed beneath the auricle.

The mechanical switch 104 includes a control component that is exposed on the outside of the rear face 103 of the main body case 102 through an opening 106 formed in the rear face 103. The wearer adjusts the gain of the LSI chip 105 by using a finger to turn the mechanical switch 104 in the lengthwise (up and down) direction of the main body case 102. This allows the speech output of the right volume for the wearer to be obtained. The control component of the mechanical switch 104 sticks out from the rear face 103 of the main body case 102 so that it can be easily recognized with the pulp of the fingertip of the person wearing the BTE hearing aid 101, and can be easily operated.

A battery holder 110 is openably and closeably provided to the bottom face 102*c* of the main body case 102, and a protrusion 111 for opening and closing the battery holder 110 is formed protruding downward from the bottom face 102*c* of the main body case 102. The wearer opens and closes the battery holder 110 by moving the protrusion 111 with a finger. The hearing aid 101 may be so designed to be switched on and off by the opening/closing operation of the battery holder 110. In this case, because the protrusion 111 sticks down below the main body case 102, it prevents the wearer from accidentally touching the protrusion 111 and opening the battery holder 110.

1.2 Internal Configuration of Hearing Aid 101

Figure 2:
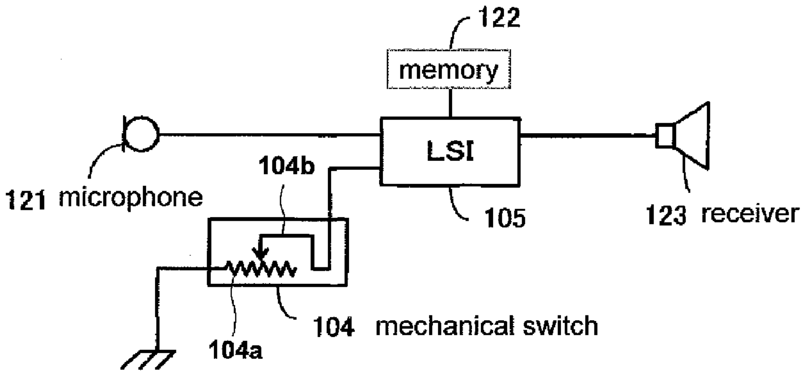
FIG. 2 is an overall block diagram, mainly of the internal configuration, of the hearing aid 101 pertaining to this embodiment.

FIG. 2 is an overall block diagram, mainly of the internal configuration, of BTE hearing aid 101 pertaining to this embodiment.

The hearing aid 101 of this embodiment comprises a microphone 121, the LSI chip 105, a receiver 123, the mechanical switch 104, and a memory 122. The microphone 121 converts sound into an electrical signal. The LSI chip 105 is constituted by a single chip, and amplifies the electrical signal, as will be discussed below. The receiver 123 is an earphone, speaker, or the like, and converts the output signal from the LSI chip 105 into sound via a D/A converter (not shown). The mechanical switch 104 sets the volume level through operation by the hearing aid wearer, so that the desired volume is obtained from the receiver 123. The memory 122 stores a specific degree of amplification.

As shown in FIG. 2, the mechanical switch 104 includes a variable resistor made up of electrodes 104*a* and a slider 104*b* that slides over these electrodes 104*a*. The wearer of the BTE hearing aid 101 moves the control component of the mechanical switch 104 (FIG. 1) with a fingertip, which changes and sets the resistance value of the variable resistor. As will be discussed below through reference to FIG. 3, the LSI chip 105 includes an electrical switch 105*b* (an example of a second volume adjuster).

The mechanical switch 104 pertaining to this embodiment sets the resistance value according to the volume level within a range that is not higher than the upper limit set by the electrical switch 105*b* as discussed below.

The LSI chip 105 detects the resistance value of the mechanical switch 104. The concept of "detects the resistance value" here may be such that a fluctuation in the resistance value of the variable resistor caused by operation of the mechanical switch 104 is detected, and the changed resistance value is acquired. Alternatively, the LSI chip 105 may periodically acquire the resistance value of the variable resistor. If the detected resistance value is at or under a specific threshold, the degree of amplification is set according to the resistance value of the mechanical switch 104. On the other hand, if the detected resistance value is over the specific threshold, the degree of amplification is set to a specific value within a range that is not higher than the above-mentioned upper limit. The above-mentioned specific threshold is a pre-set value, for example, and is stored in the memory 122.

The LSI chip 105 will now be described in detail.

1.2.1: LSI Chip 105

Figure 3:
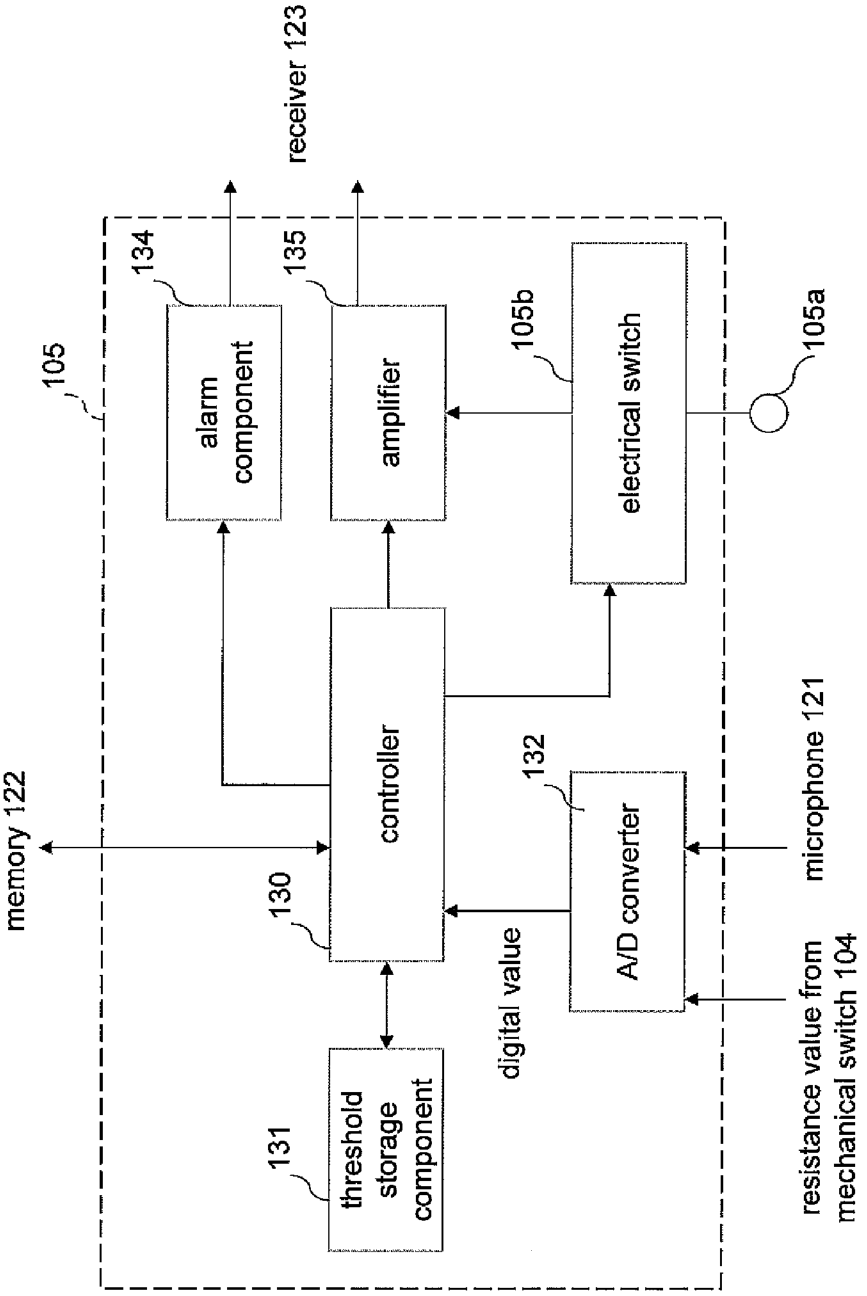
FIG. 3 is a simplified diagram of the internal configuration of an LSI chip 105 of the hearing aid 101 pertaining to this embodiment.

FIG. 3 is a simplified diagram of the internal configuration of the LSI chip 105 of the BTE hearing aid 101 pertaining to this embodiment.

As shown in FIG. 3, the LSI chip 105 comprises a controller 130, a threshold storage component 131, an A/D converter 132, the electrical switch 105*b*, an alarm component 134, and an amplifier 135. The controller 130 is connected to the various constituent elements of the LSI chip 105 as discussed below, and controls these constituent elements. The threshold storage component 131 stores a specific threshold. The A/D converter 132 converts the resistance value (analog) from the mechanical switch 104 into a digital value. The electrical switch 105*b* sets the degree of amplification of the electrical signal inputted from the microphone 121, within a range that is not higher than the upper limit pre-set to suit the wearer, as discussed below. The alarm component 134 issues an alarm by sound or the like. The amplifier 135 is connected to the electrical switch 105*b*, amplifies the electrical signal supplied from the microphone 121 according to the degree of amplification set by the electrical switch 105*b*, and outputs to the receiver 123 (earphone or speaker). The above-mentioned specific threshold is stored in the memory 122, and is put into the threshold storage component 131 as soon as the power is switched on to the hearing aid 101.

The controller 130 detects the resistance value of the mechanical switch 104 obtained from the A/D converter 132, recognizes a malfunction when it is determined that the detected resistance value (digital value) exceeds the threshold, and commands the alarm component 134 to issue an alarm. The controller 130 also sets the degree of amplification by the amplifier 135 to a specific value when it is determined that the resistance value has exceeded the threshold. Details of the control method used by the controller 130 will be discussed below through reference to FIG. 4.

An external communication terminal 105*a* is connected to the electrical switch 105*b*. The external communication terminal 105*a* connects to an external device such as a hearing aid adjustment apparatus (such as a computer terminal that executes specific software) during the fitting of the hearing aid 101. Consequently, the external device is connected with the electrical switch 105*b* via the external communication terminal 105*a*. The LSI chip 105 sets the upper limit of the degree of amplification by the amplifier 135 according to the hearing of the hearing aid wearer at the time of fitting. The mechanical switch 104 suitably sets the degree of amplification within a range that is not higher than the upper limit of the degree of amplification set by the electrical switch 105*b*.

Volume adjustment with the mechanical switch 104 and the electrical switch 105*b* will now be described.

1.2.2: Volume Adjustment with Mechanical Switch 104 and Electrical Switch 105*b*

The maximum degree of amplification of the hearing aid 101 is essentially determined by the capacity of the amplifier 135. Depending on the hearing loss of the wearer, there may be cases in which the maximum degree of amplification determined by the capacity of the amplifier 135 is not necessary. Therefore, with the hearing aid 101, the maximum degree of amplification for each hearing aid wearer, that is, the upper limit to the degree of amplification, is set with the electrical switch 105*b* within a range that is not higher than the maximum degree of amplification determined by the capacity of the amplifier 135. The upper limit to the degree of amplification set for each wearer with the electrical switch 105*b* is usually set by using the above-mentioned hearing aid adjustment apparatus or other such external device during the fitting of the hearing aid 101. The wearer adjusts the mechanical switch 104, but the degree of amplification is set within a range that is not higher than the upper limit of the degree of amplification set during fitting with the electrical switch 105*b*. The wearer adjusts the graduations of the mechanical switch 104 according to the environment in which the hearing aid will be used (such as a quiet environment or a noisy environment), allowing the degree of amplification to be adjusted properly and easily.

As discussed above, with the BTE hearing aid 101 of this embodiment, the volume is adjusted and set with two volume adjusters, namely, the mechanical switch 104 and the electrical switch 105*b*. With this constitution, volume adjustment with the mechanical switch 104 is easier, and the reliability of volume adjustment with the electrical switch 105*b* is improved.

However, the mechanical switch 104 is made up of mechanical parts, and some of them are exposed on the outside of the main body case 102 (see FIG. 1). Therefore, malfunctions caused by discontinuity, rust, or the like in which the resistance becomes infinitely large are more likely to occur than in the electrical switch 105*b*. More specifically, when perspiration or other such moisture adheres to the mechanical switch 104, the electrodes 104*a* and slider 104*b* constituting the mechanical switch will corrode and oxidize, resulting in an insulating state between the electrodes, so the resistance value rises to infinity. Therefore, regardless of the setting on the mechanical switch 104, the controller 130 of the LSI chip 105 ends up detecting an infinitely large resistance value for the variable resistor of the mechanical switch.

In view of this, when a resistance value that exceeds the specific threshold is detected by the LSI chip 105 with the BTE hearing aid 101 of this embodiment, it is recognized that the mechanical switch 104 has malfunctioned, and volume control is performed. More specifically, if it is determined that the mechanical switch 104 has malfunctioned, the controller 130 reproduces sound at a volume (specific value) that is less than the maximum. Specifically, the LSI chip 105 stores the threshold of resistance (such as 260 ohms) or a voltage value corresponding to that value in the threshold storage component 131, and the controller 130 monitors the resistance value of the mechanical switch 104.

If the controller 130 determines that the detected resistance value of the mechanical switch 104 exceeds the threshold stored in the threshold storage component 131, it deems that the mechanical switch 104 has malfunctioned, controls the amplifier 135 at the specific degree of amplification pre-set with the electrical switch 105*b*, and reproduces sound at a suitable volume.

For instance, as shown in Table 3 below, assume that when the wearer of the hearing aid 101 sets the graduations on the mechanical switch 104 are set to "3" to match his own hearing, it is conceivable that there will be discontinuity in the mechanical switch 104, and that this will cause the resistance value of the variable resistor to go to infinite ohms. The controller 130 of the LSI chip 105 recognizes that the resistance value has exceeded the threshold (such as 260 ohms), and causes the amplifier 135 to amplify at a specific degree of amplification that is not higher than the upper limit of the degree of amplification set with the electrical switch 105*b*. The above-mentioned specific value of "200" is stored ahead of time in the memory 122, for example.

Therefore, even if the volume switch should malfunction and discontinuity should occur between the mechanical switch 104 and the LSI chip 105, sound will not be reproduced at the maximum volume (sound amplified at the maximum degree of amplification determined by the capacity of the amplifier 135), which would otherwise startle the hearing aid wearer, injure the wearer's ear, or cause other such problems.

TABLE 3

| Graduation on Mechanical Switch | Value of Variable Resistor | Degree of Amplification by LSI (after A/D conversion) | Volume |
|---|---|---|---|
| 3 | Infinitely high ohms | 200 | Volume according to Specific Amplification (200), which is not higher than the upper limit of the mechanical switch |

1.3: Operation of Hearing Aid 101

Figure 4:
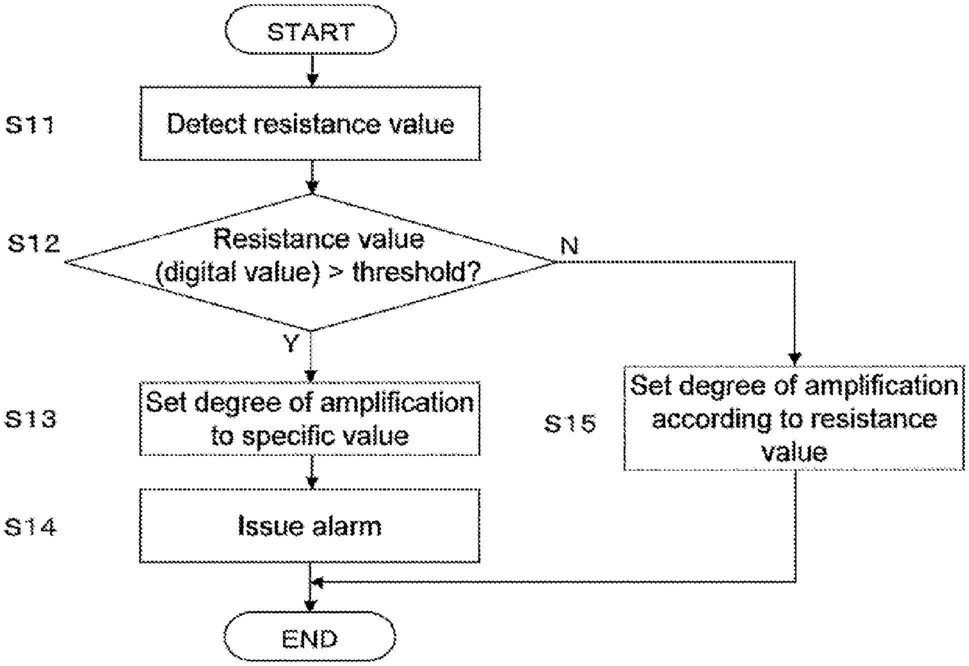
FIG. 4 is a flowchart illustrating the operation of the hearing aid pertaining to this embodiment.
Figure 5A:
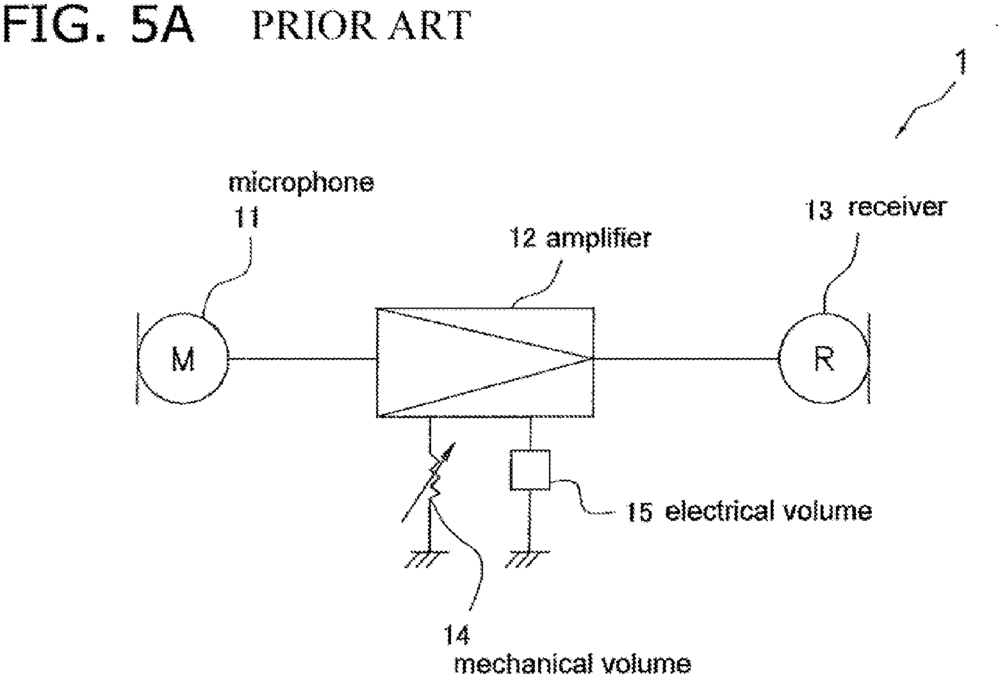
FIG. 5A PRIOR ART
FIG. 5A is a diagram of the configuration of a conventional hearing aid.
Figure 5B:
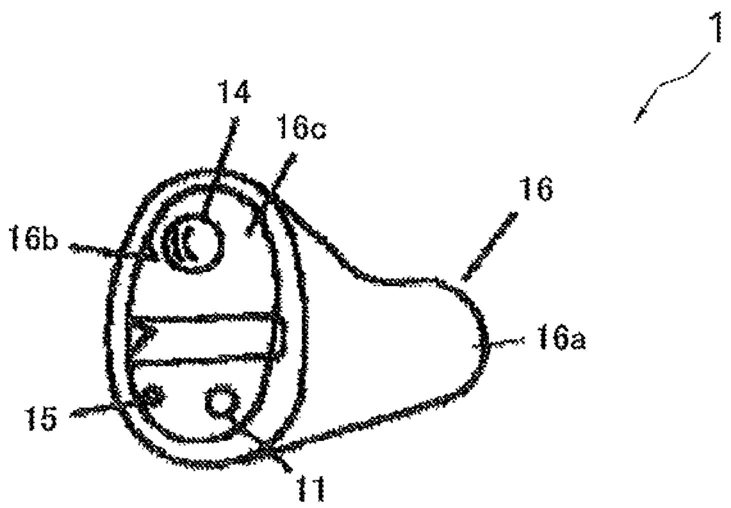
FIG. 5B PRIOR ART
FIG. 5B is a diagram of the outside of the conventional hearing aid.
Figure 6:
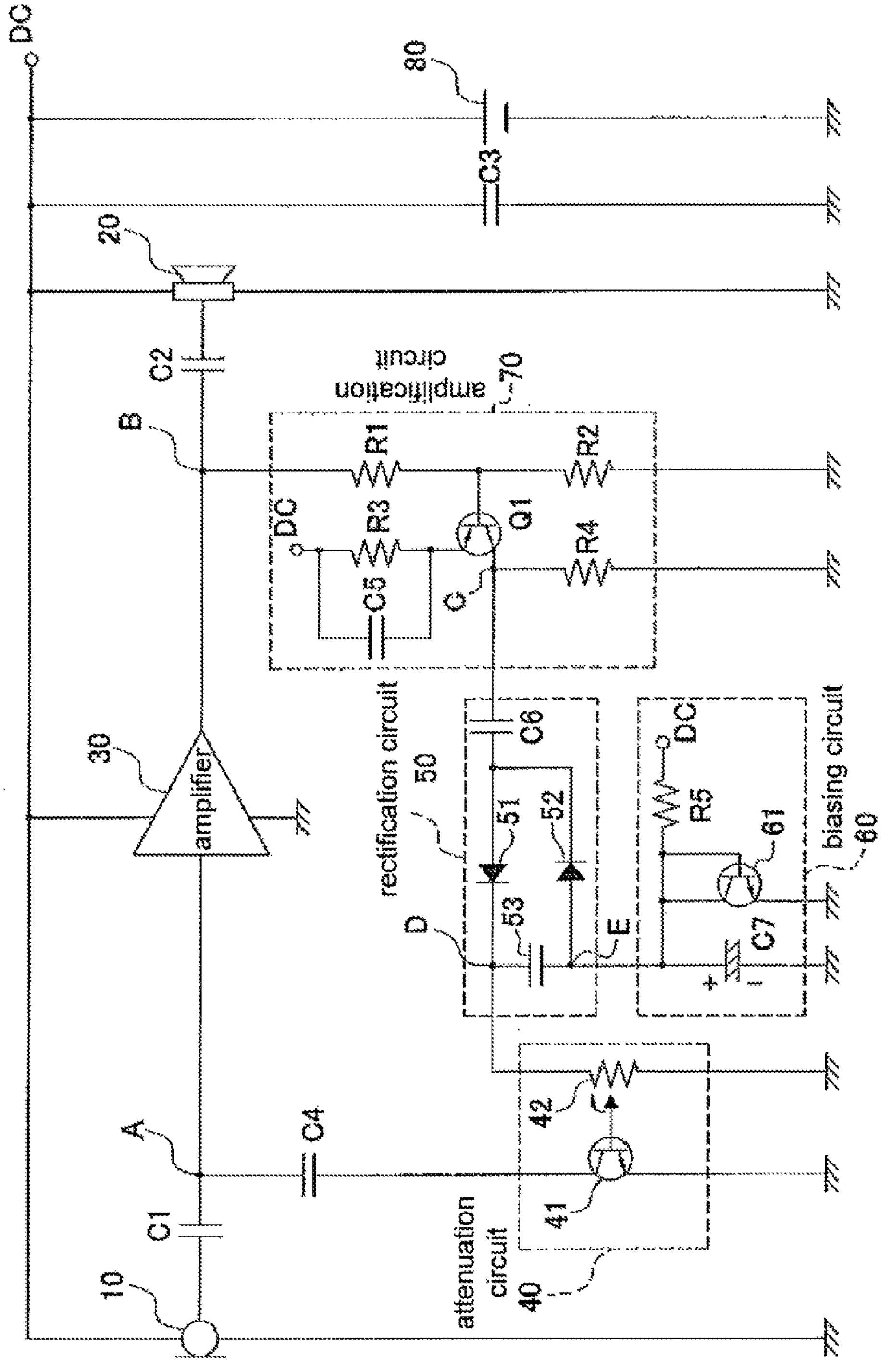
FIG. 6 PRIOR ART
FIG. 6 is a diagram of the internal configuration of another conventional hearing aid.

FIG. 4 is a flowchart illustrating the operation of the hearing aid 101 pertaining to this embodiment. The operation of this hearing aid 101 is mainly controlled by the controller 130 of the LSI chip 105.

Step S11: The controller 130 detects the resistance value of the mechanical switch 104.

Step S12: The controller 130 compares the detected resistance value with the threshold stored in the threshold storage component 131. If the resistance value of the mechanical switch 104 is greater than the threshold, then the flow proceeds to step S13, and if the resistance value is at or under the threshold, the flow proceeds to step S15.

Step S13: The controller 130 sets the degree of amplification by the amplifier 135 to the specific value read from the memory 122.

Step S14: The controller 130 issues a command to the alarm component 134, and generates a sound or the like to notify the wearer that the mechanical switch 104 has malfunctioned due to discontinuity or the like.

Step S15: On the other hand, if the resistance value is at or under the threshold, the controller 130 sets the degree of amplification by the amplifier 135 according to the resistance value of the mechanical switch 104.

1.4: Features of Hearing Aid 101

As described above, with the hearing aid 101 pertaining to this embodiment, when the controller 130 of the LSI chip 105 has determined that the detected resistance value of the mechanical switch 104 exceeds the threshold, the degree of amplification by the amplifier 135 is automatically set by the electrical switch 105*b* to a specific value in a range that is not higher than the upper limit. Therefore, even if the mechanical switch 104 should malfunction and discontinuity should occur between it and the LSI chip 105, sound will not be reproduced at the maximum volume (sound amplified at the maximum degree of amplification determined by the capacity of the amplifier 135), which would otherwise startle the hearing aid wearer, injure the wearer's ear, or cause other such problems, and speech reproduction at a suitable volume is guaranteed.

Also, with the hearing aid 101 pertaining to this embodiment, when the controller 130 of the LSI chip 105 has determined that the resistance value of the mechanical switch 104 exceeds the threshold, the alarm component 134 recognizes this as a malfunction and issues an alarm. Therefore, even if the hearing aid wearer sets the graduations on the mechanical switch 104 to the highest mark, making it more difficult to recognize a malfunction, the wearer can still be notified of a malfunction by the mechanical switch 104.

Also, since the hearing aid 101 pertaining to this embodiment comprises the memory 122, and a specific degree of amplification (such as 200) is stored in the memory 122, if the mechanical switch 104 should malfunction, the volume can be set as dictated by the hearing of the wearer.

Also, with the hearing aid 101 pertaining to this embodiment, since the LSI chip 105 comprises a threshold storage component for storing a specific threshold, even if the mechanical switch 104 malfunctions and the resistance value goes to infinity, this can be easily detected.

2. Modification Examples

2.1

In the above embodiment, the controller 130 of the LSI chip 105 determines the degree of amplification by the amplifier 135 on the basis of the specific degree of amplification stored ahead of time in the memory 122 when the detected resistance value of the mechanical switch 104 exceeds the threshold stored in the threshold storage component 131. Instead, however, a degree of amplification corresponding to the resistance value of the variable resistor of the mechanical switch 104 used in the past (according to the graduations on the mechanical switch 104) may be stored in the memory 122, and this degree of amplification may be set as the degree of amplification in the amplifier 135. Also, the stored resistance value may be the resistance value that was set immediately before, the average value or most frequent value of a plurality of resistance values used in the past, or the like.

When the hearing aid 101 has a constitution such as this, there is no need for a specific degree of amplification to be stored ahead of time, and if the mechanical switch 104 should malfunction and cause discontinuity, sound can be reproduced at the volume ordinarily used by the hearing aid wearer.

2.2

In the above embodiment, the hearing aid was a hook-on type, but the present invention is not limited to this. For example, the present invention can be applied to other types of hearing aid, such as an earhole type, a box type, or an eyeglass type.

2.3

In addition to sound, the alarm component 134 may issue an alarm indicating that the mechanical switch 104 has malfunctioned by using light, vibration, heat, or the like. Furthermore, a display may be provided to the hearing aid so that the alarm may be displayed.

2.4

The LSI chip 105 was provided in the above embodiment, but the method for circuit integration is not limited to LSI. Also, the method for controlling the volume of the hearing aid in the above embodiment may entail, at least partially, executing a program with a processor.

2.5

The present invention can also be applied to a hearing aid with which the upper limit to the degree of amplification by the amplifier 135 is not set according to the hearing aid wearer, as long as the specific value set when it is determined that the resistance value has exceeded the specific threshold is already a suitable degree of amplification.

An embodiment of the present invention was described above, but the present invention is not limited to what was given in the above embodiment, and the present invention assumes that a person skilled in the art will make modifications or applications on the basis of the text of the Specification and known technology, and these are included in the scope for which protection is sought.

INDUSTRIAL APPLICABILITY

The present invention can be applied to a hearing aid with which the reproduction of sound at the proper volume is guaranteed even if the mechanical volume adjusting means should malfunction.

EXPLANATION OF REFERENCE

| | |
|---|---|
| 10, 11 | microphone |
| 12 | amplifier |
| 13 | receiver |
| 14 | mechanical volume |
| 15 | electrical volume |
| 16 | casing |
| 16a | insertion component |
| 16b | control component |
| 16c | attachment face |
| 20 | earphone |
| 30 | amplifier |
| 40 | attenuation circuit |
| 41, 61 | transistor |
| 42 | variable resistor |

-continued

| | |
|---|---|
| 50 | rectification circuit |
| 51, 52 | diode |
| 53 | smoothing capacitor |
| 60 | biasing circuit |
| 70 | amplification circuit |
| 80 | battery |
| 101 | BTE hearing aid (hearing aid) |
| 102 | main body case |
| 103 | rear face |
| 104 | mechanical switch (first volume adjuster) |
| 104a | electrode |
| 104b | slider |
| 105 | LSI chip (processor) |
| 105a | external communication terminal |
| 105b | electrical switch (second volume adjuster) |
| 106 | opening |
| 110 | battery holder |
| 111 | protrusion for opening and closing |
| 121 | microphone |
| 122 | memory |
| 123 | receiver |
| 130 | controller |
| 131 | threshold storage component |
| 132 | A/D converter |
| 133 | detector |
| 134 | alarm component |
| 135 | amplifier |

The invention claimed is:

1. A hearing aid, comprising:

a main body case;

a microphone disposed inside the main body case and configured to convert sound into an electrical signal;

a processor disposed inside the main body case;

a first volume adjuster having a variable resistor and a control component, the control component being disposed so as to be exposed on an outside of the main body case and configured to set a resistance value of the variable resistor;

a receiver configured to convert the electrical signal into sound; and a memory, wherein the processor includes:

an amplifier configured to amplify the electrical signal from the microphone;

a second volume adjuster configured to set a degree of amplification by the amplifier according to the resistance value of the variable resistor of the first volume adjuster; and a controller configured to control the amplifier and the second volume adjuster, wherein the memory is connected to the controller and configured to store a specific value for the degree of amplification by the amplifier, the specific value being fixed, wherein the controller detects the resistance value of the variable resistor of the first volume adjuster, wherein the controller determines whether or not the resistance value has exceeded a specific threshold, so as to determine whether or not there is a disconnection between the variable resistor of the first volume adjuster and the second volume adjuster, and wherein, when the controller determines that the resistance value has exceeded the specific threshold and that there is the disconnection between the variable resistor of the first volume adjuster and the second volume adjuster, the controller acquires the specific value from the memory and sets the degree of amplification by the amplifier to the specific value.

2. The hearing aid according to claim 1, wherein the second volume adjuster sets an upper limit to the degree of amplification by the amplifier, and sets the degree of amplification by the amplifier within a range that is not higher than the upper limit, and wherein, when the controller determines that the resistance value has exceeded the specific threshold, the controller acquires the specific value from the memory, such that the degree of amplification by the amplifier is not higher than the upper limit.

3. The hearing aid according to claim 1, wherein the processor includes an alarm connected to the controller and configured to issue a warning when the controller determines that the resistance value has exceeded the specific threshold.

4. The hearing aid according to claim 1, wherein the specific value is the degree of amplification according to a value related to a specific resistance value set in the past by the first volume adjuster.

5. The hearing aid according to claim 1, wherein the processor includes a threshold storage component configured to store the specific threshold.

6. A method of controlling a volume of a hearing aid including: a microphone configured to convert sound into an electrical signal; a first volume adjuster including a variable resistor; an amplifier configured to amplify an electrical signal from the microphone; a receiver configured to convert the amplified electrical signal into sound; a processor configured to control the amplifier; and a memory, the method comprising:

setting a resistance value of the variable resistor of the first volume adjuster;

detecting, via the processor, the resistance value of the variable resistor of the first volume adjuster;

determining, via the processor, whether or not the detected resistance value has exceeded a specific threshold, so as to determine whether or not there is a disconnection between the variable resistor of the first volume adjuster and the second volume adjuster;

setting, via a second volume adjuster of the processor, a degree of amplification for the electrical signal according to the detected resistance value of the variable resistor of the first volume adjuster, when the determining determines that the detected resistance value does not exceed the specific threshold; and when the determining determines that the detected resistance value has exceeded the specific threshold and that there is the disconnection between the variable resistor of the first volume adjuster and the second volume adjuster:

acquiring, from the memory, a specific value for the degree of amplification of the electrical signal by the amplifier, the specific value being fixed; and setting, via the processor, the degree of amplification by the amplifier to the acquired specific value.

* * * * *